United States Patent
Gossmann et al.

(10) Patent No.: US 10,931,233 B2
(45) Date of Patent: Feb. 23, 2021

(54) RESONATOR-BASED OPEN-LOOP TIMING SIGNAL GENERATION

(71) Applicant: Intel Corporation, Santa Clara, CA (US)

(72) Inventors: Timo Gossmann, Neubiberg (DE); Alexander Belitzer, Munich (DE)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 16/367,668

(22) Filed: Mar. 28, 2019

(65) Prior Publication Data

US 2020/0313618 A1    Oct. 1, 2020

(51) Int. Cl.
| | |
|---|---|
| *H03B 5/18* | (2006.01) |
| *H03B 5/06* | (2006.01) |
| *H04L 7/00* | (2006.01) |
| *H03C 3/09* | (2006.01) |
| *H03L 7/081* | (2006.01) |

(52) U.S. Cl.
CPC ............. *H03B 5/18* (2013.01); *H03B 5/06* (2013.01); *H03C 3/0925* (2013.01); *H03C 3/0941* (2013.01); *H03C 3/0975* (2013.01); *H03L 7/0814* (2013.01); *H04L 7/0016* (2013.01)

(58) Field of Classification Search
CPC .......... H03B 5/18; H03B 5/06; H03C 3/0925; H03C 3/0941; H03C 3/0975; H03L 7/0814; H03L 7/016
See application file for complete search history.

(56) References Cited

U.S. PATENT DOCUMENTS

| | | | | |
|---|---|---|---|---|
| 4,206,421 A * | 6/1980 | Bernhard | ............... | H03L 7/20 331/19 |
| 4,516,085 A * | 5/1985 | Effinger | ............... | H03B 21/02 331/40 |
| 7,928,808 B2 * | 4/2011 | Chan | ............... | H03B 21/02 331/179 |

(Continued)

OTHER PUBLICATIONS

Bahr, Bichoy et al. "32GHz Resonant-Fin Transistors in 14nm FinFET Technology." ISSCC 2018/Session 21/Extending Silicon and Its Applicaitons/21.3. 2018 IEEE International Solid-State Circuits Conference. 3 pages.

*Primary Examiner* — Jeffrey M Shin
(74) *Attorney, Agent, or Firm* — Viering, Jentschura & Partner mbB

(57) ABSTRACT

Systems, methods, and circuitries are provided for generating timing signals with a resonator-based open-loop oscillator circuitry. In one example, a system that generates a timing signal based on a target signal includes a plurality of oscillator units configured to generate a respective plurality of oscillator signals. Each oscillator unit includes a resonator that operates in an open-loop mode to generate a resonator signal having a resonator frequency. The resonator signal is used by core circuitry to generate a respective oscillator signal having a respective oscillator frequency. The resonator frequencies of the resonators in the plurality of oscillator units are different from one another. The system also includes a selector circuitry configured to select one of the plurality of oscillator units based on the target signal and provide a selected oscillator signal generated by the selected oscillator unit as the timing signal.

23 Claims, 8 Drawing Sheets

(56) References Cited

U.S. PATENT DOCUMENTS

| | | |
|---|---|---|
| 9,008,252 B2 | 4/2015 | Mayer et al. |
| 9,407,201 B1* | 8/2016 | Iguchi .................... H03B 5/06 |
| 2011/0279165 A1* | 11/2011 | Minassian .............. H03B 21/00 |
| | | 327/356 |
| 2016/0056252 A1* | 2/2016 | Kim .................. H01L 29/42356 |
| | | 310/317 |

* cited by examiner

RESONATOR-BASED OPEN-LOOP TIMING SIGNAL GENERATION

BACKGROUND

Timing signals are critical to proper operation of wireless communication devices. As frequencies increase and carrier aggregation widens the bandwidths of the signals that wireless devices process, it is becoming more challenging to generate the requisite variety of high quality timing signals while maintaining low power consumption and a small timing signal system footprint.

DESCRIPTION

Figure 1A:
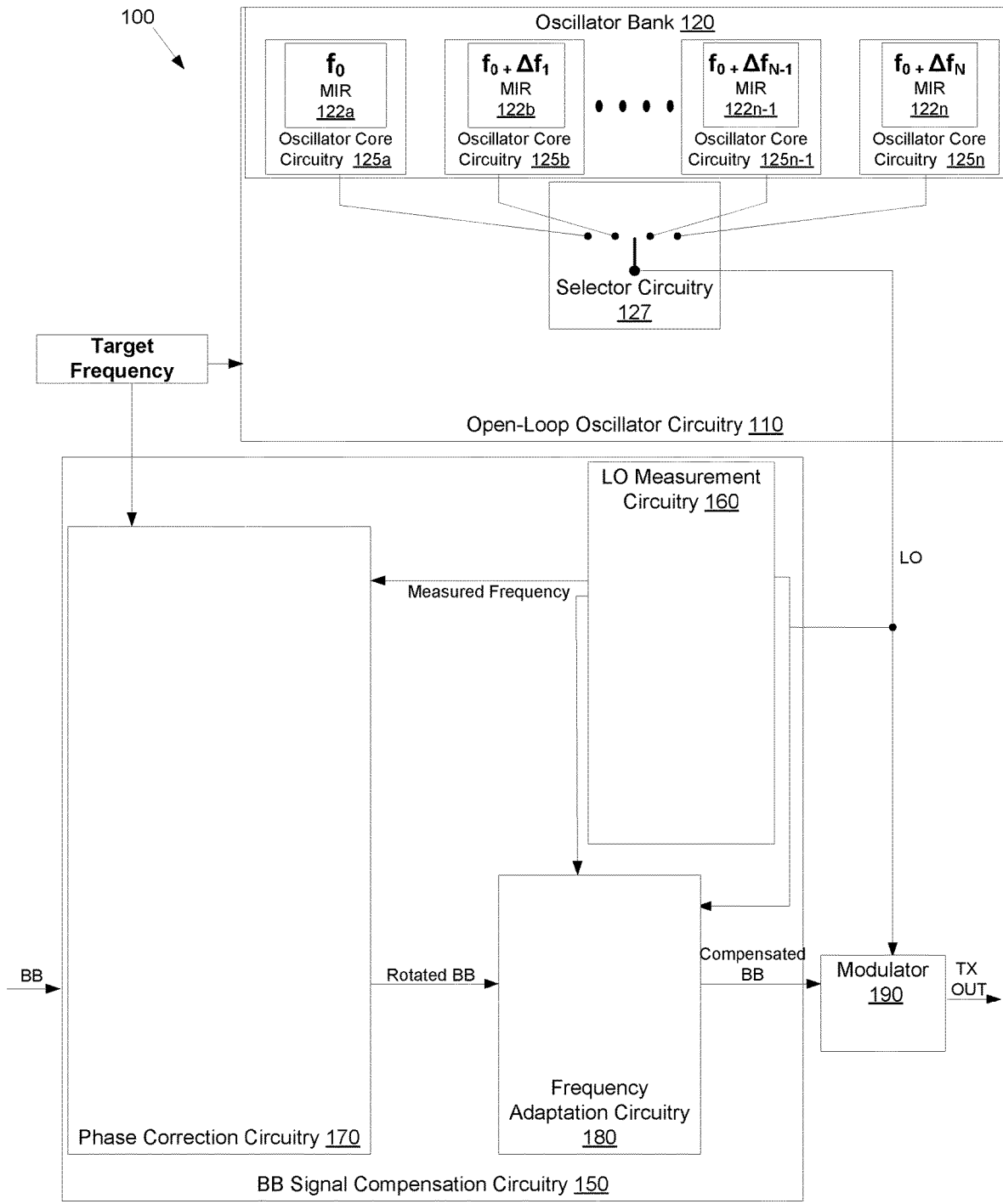
FIG. 1A illustrates an exemplary transmitter that includes open-loop oscillator circuitry and baseband (BB) signal compensation circuitry in accordance with various aspects described.

Recently FinFET based resonators have become subject of research. The resonance frequency of these resonators can be tuned by exploiting several geometrical variations of the transistor array structure/transistor dimension (device length) within tolerated/allowed design rule options. Results show that these resonators offer a very high quality factor (Q) which allows their use in building oscillators with extremely high spectral purity. However, it is not feasible to tune the resonance frequency after manufacture of the resonator because the resonance frequency is a pure function of geometry and temperature.

With modern 16 mm FinFET technologies resonance frequencies in the range of 39 GHz are observed. Experimental and simulation results show that several FinFET geometries can be defined which differ by about 200 MHz in resonance frequency and have resonance frequencies that, in aggregate, span a total range of about 1 GHz. This means that with five resonators so configured, a frequency range of 1 GHz can be covered having a tone spacing of 200 MHz.

The expected very high spectral purity of these resonators makes FinFET-based oscillator units a good candidate for local oscillator (LO) frequency synthesis in radio frequency transceiver architectures. With appropriate frequency division, oscillator units using FinFETs with a 39 GHz resonance/oscillator frequency can be used to cover roughly all sub 6 GHz bands defined for cellular communication networks (i.e., in a 3GPP standardization defined FR1 range). With a multitude of FinFET oscillator units having oscillator frequencies spaced about 200 MHz apart, the resulting frequency spacing after division is also in the few MHz range. For example, dividing 39 GHz by 5 . . . 6, results in a tone spacing of only 30 . . . 40 MHz after division.

Building a transmitter using a divided output of a FinFET-based oscillator unit as the LO signal is not straight forward. First of all, despite the high spectral purity of the oscillator unit's signal, the oscillator frequency is not susceptible to tuning by means of a control loop or phase locked loop (PLL). This means that the oscillator frequency is more or less fixed (because of the high resonator Q). Second, the oscillator frequency is not precisely determined and will vary. Technological variations cause expected sample-to-sample variations in the range of some MHz and in addition the oscillator frequency is subject to drift during operation because of thermal excitations of the resonator.

Currently, work is being conducted to explore oscillation structures in CMOS technologies based on a planar transistor (not FinFET). Once these structures are sufficiently developed, planar transistors may be used in oscillator units in place of FinFETs. In addition to generating very high frequencies as compared to crystal-based resonators, Fin-FET or planar transistor resonators can be monolithically integrated (e.g., manufactured on the same semiconductor device using the same manufacturing methods) with the other circuitry such as dividers, switches, and so on, that would be used to implement an oscillator system. In the following description, the term "monolithically integratable resonator" ("MIR") is meant to include any resonator such as a FinFET, a planar transistor, or any other semiconductor device that is capable of generating high frequency, high Q signals without needing a control loop. While the following description will be in the context of FinFETs as resonators in oscillator units, it is to be understood that planar transistors or other MIRs may be used interchangeably.

Described herein are systems, circuitries, and methods that allow a bank of one or more MIR-based oscillator units to be used to generate timing signals, such as LO signals. In one example, baseband compensation circuitry adjusts a baseband signal that is being upconverted (or downconverted) using an LO signal generated by a MIR-based oscillator unit to compensate for a difference between a measured LO frequency and a target LO frequency. In another example, signals from MIR-based oscillator units are combined in different ways to generate a variety of timing signals.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 2:
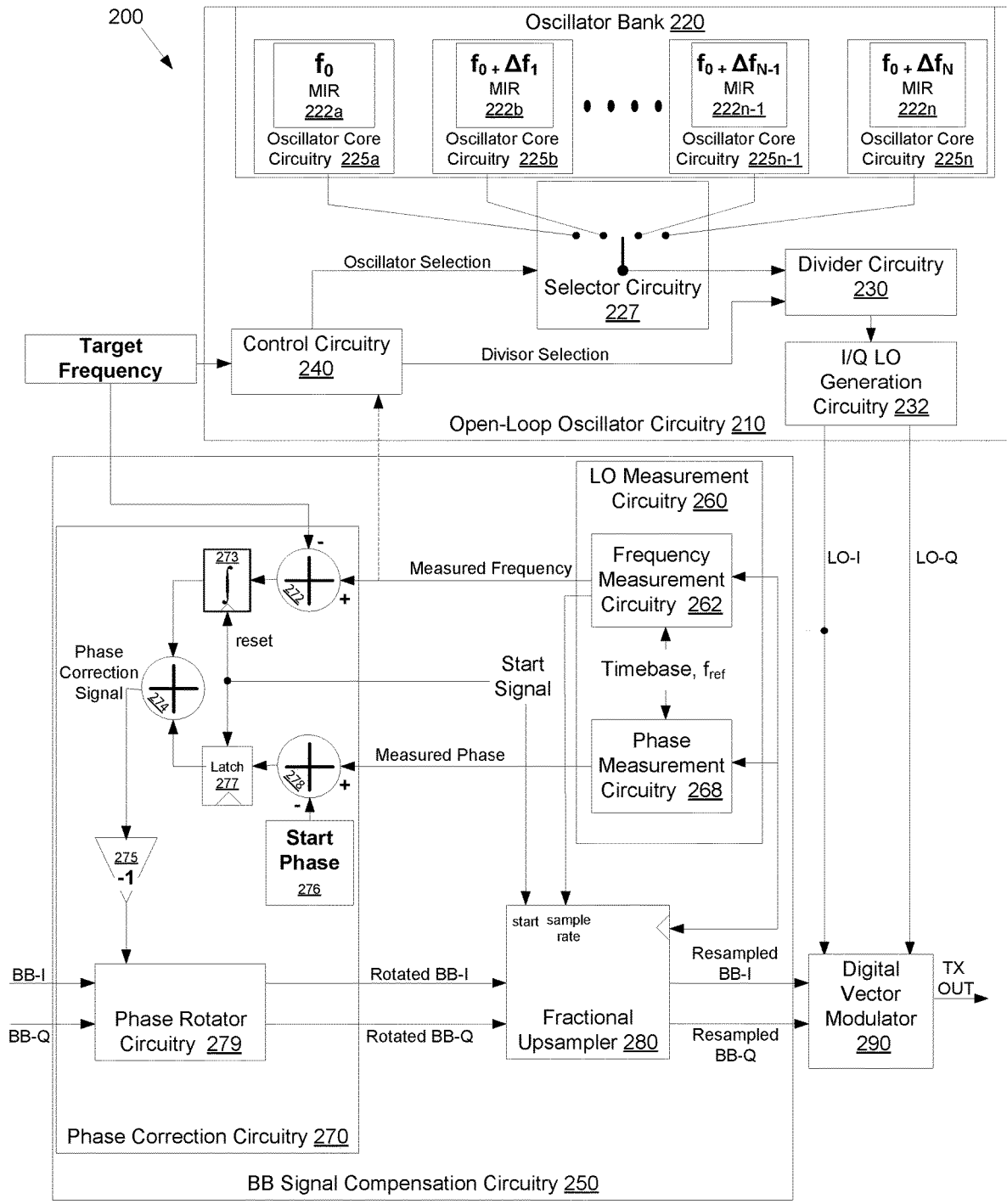
FIG. 2 illustrates an exemplary transmitter that includes open-loop oscillator circuitry and BB signal compensation circuitry in accordance with various aspects described.
Figure 3:
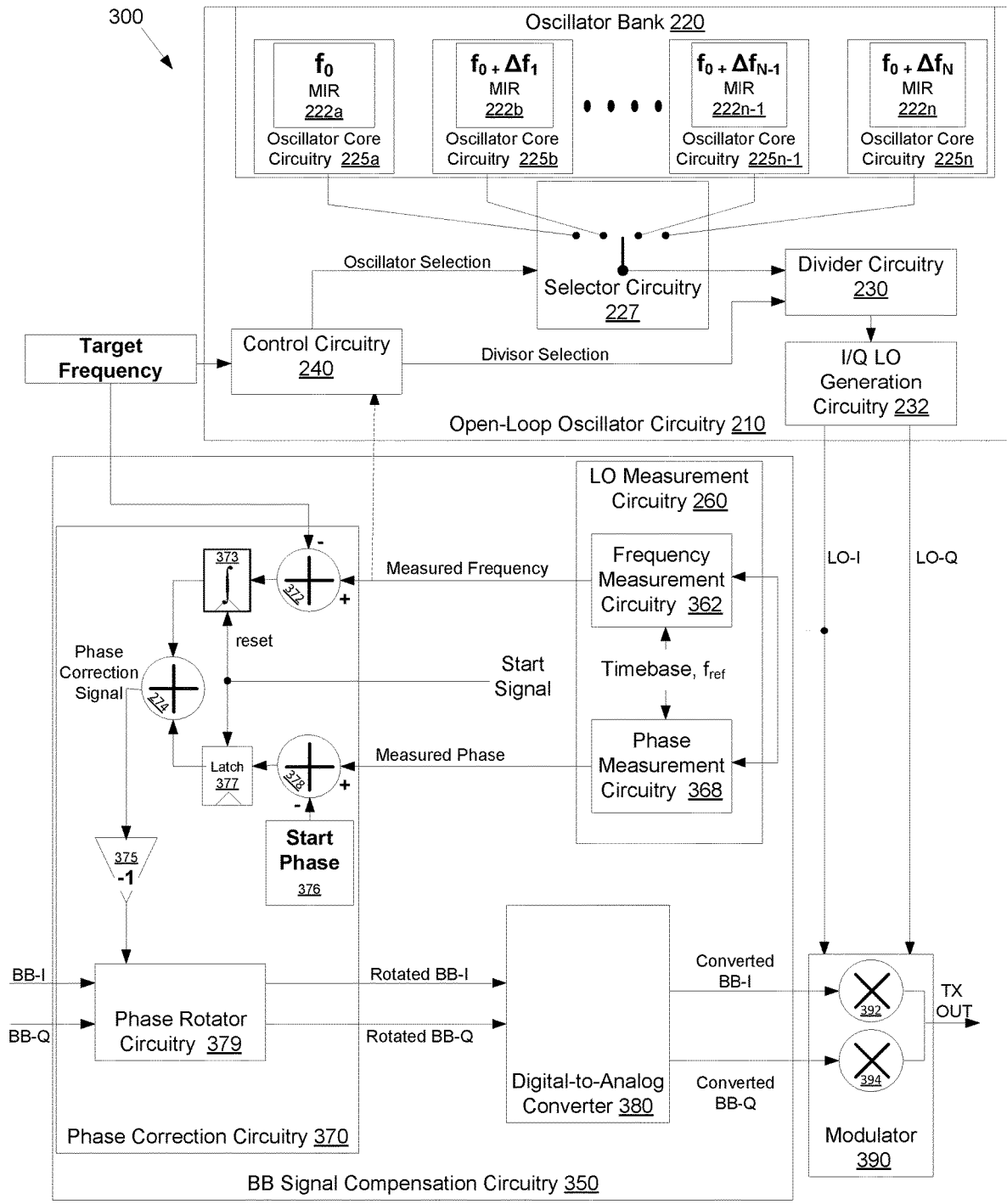
FIG. 3 illustrates an exemplary transmitter that includes open-loop oscillator circuitry and BB signal compensation circuitry in accordance with various aspects described.

FIG. 1A illustrates an exemplary transmitter 100 that processes a baseband (BB) signal to generate a transmit (TX) signal at a target frequency which is based on the operating frequency of the transmitter. While FIGS. 1-3 illustrate a transmitter, the described systems, methods, and circuitries, are equally applicable to a receiver or transceiver that receives a receive signal at a receive frequency and processes the received signal to generate a BB signal. The transmitter includes open-loop oscillator circuitry 110 and BB signal compensation circuitry 150.

The open-loop oscillator circuitry 110 is configured to generate a timing signal (in the illustrated example, the timing signal is an LO signal) based on the target frequency. The open-loop oscillator circuitry 110 includes an oscillator bank 120 having a plurality of oscillator units and selector circuitry 127 that includes a switch. Each oscillator unit in the oscillator bank 120 includes a MIR 122 (e.g., a FinFET) that operates in an open-loop mode to generate a resonator signal having a resonator frequency and core circuitry 125 configured to use the resonator signal to generate an oscillator signal having an oscillator frequency. The resonator frequencies of the MIRs in the plurality of oscillator units (e.g., $f_0, f_0+\Delta f_1, \ldots, f_0+f_{N-1}, f_0+\Delta f_N$) are different from one another. In one example the resonator frequencies are separated by a constant frequency range (e.g., 200 MHz) so that a continuous range of LO frequencies can be covered by the oscillator bank 120. In one example, not shown, multiple oscillator units share a single core circuitry, such that multiple MIRs are selectably connected to the core circuitry. In one example, each oscillator unit includes an arrangement of one or more FinFET devices that are mechanically or electrically connected to one another.

The selector circuitry 127 is configured to select one of the plurality of oscillator signals and output the selected oscillator signal as the timing signal. As the target frequency is changed or the resonance frequencies of the MIRs 122a-122n vary, the selector circuitry 127 may be controlled to select a different oscillator unit's oscillator signal for the LO signal.

Figure 1B:
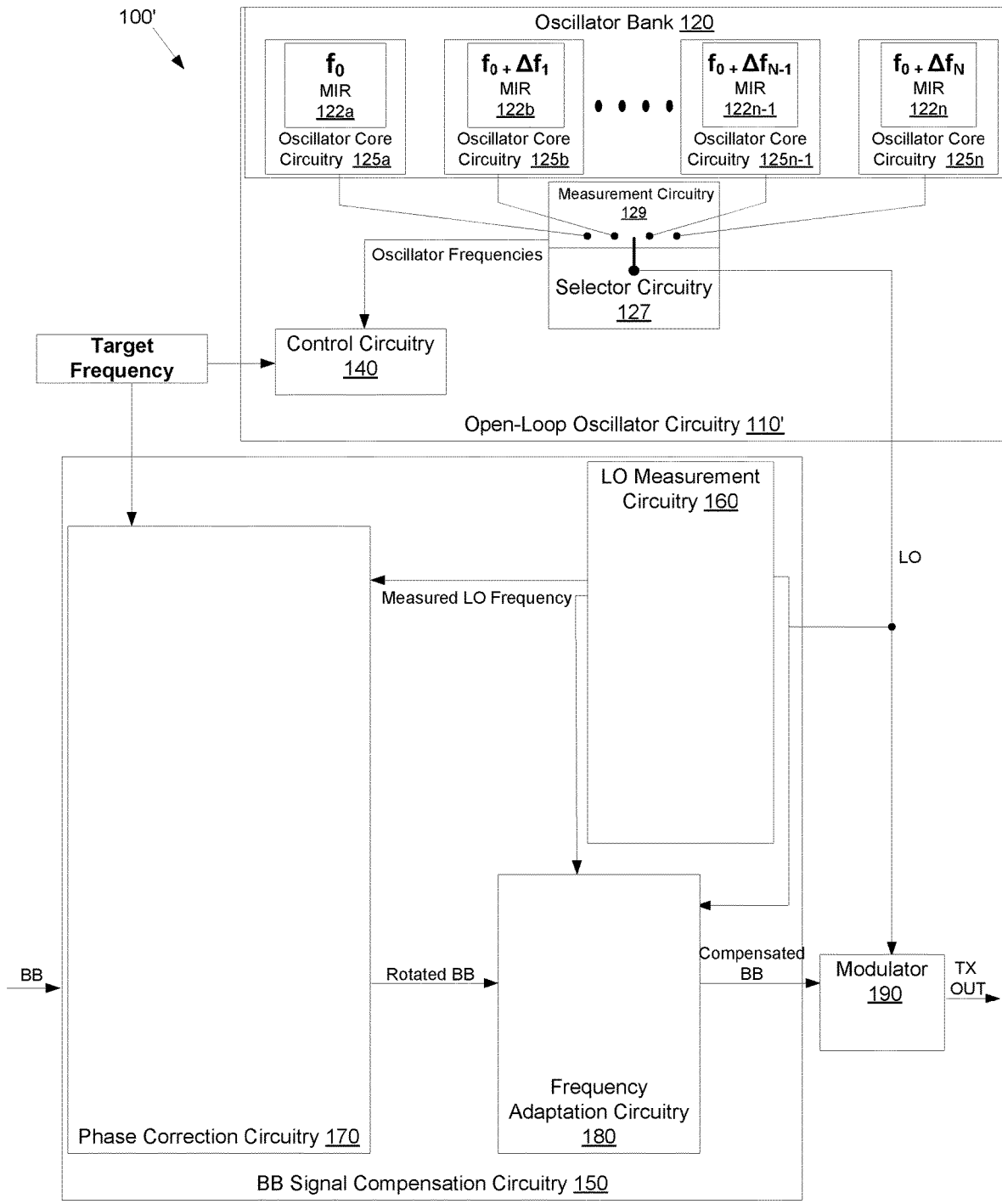
FIG. 1B illustrates an exemplary transmitter that includes open-loop oscillator circuitry and BB signal compensation circuitry in accordance with various aspects described.

FIG. 1B illustrates an exemplary transmitter 100' in which open-loop oscillator circuitry 110' includes measurement circuitry 129 that measures the frequency of the oscillator signal from each oscillator unit. Control circuitry 140 controls the selector circuitry 127 to select one of the oscillator units based on the target frequency and the measured oscillator frequencies. Having a measurement circuitry that measures the oscillator frequency of even the un-selected oscillator units can expedite the selection of an oscillator unit by the control unit 140.

Referring briefly now to FIG. 2, an exemplary open-loop oscillator circuitry 210 that is adapted for generating an LO signal for modulating I/Q signals is illustrated. In addition to an oscillator bank 220 and selector circuitry 227, the open-loop oscillator circuitry 210 includes divider circuitry 230, I/Q LO generation circuitry 232, and control circuitry 240. Recall that the resonator frequency is expected to be on the order of several tens of GHz, which is much higher than conventional TX frequencies. The divider circuitry 230 divides the selected oscillator signal by a divisor to generate the LO signal. This frequency division, in addition to producing an LO signal with an appropriate frequency, also improves the phase noise of the oscillator signal, making the divided oscillator signal sufficiently high in quality for use as an LO signal in sub-6 GHz cellular communication networks without need for a phase locked loop (PLL).

The control circuitry 240 is configured to generate an oscillator selection signal based on the target frequency. The oscillator selection signal controls the selector circuitry 227 to select one of the plurality of oscillator signals. The control circuitry 240 also generates a divisor selection signal that brings the selected oscillator signal's frequency closest to the target frequency. The frequency of the selected oscillator unit may be determined by the control circuitry 240 based on a measurement of the LO signal frequency that is made by LO measurement circuitry 260. The divided oscillator signal output by the divider circuitry 230 is split into separate I and Q LO signals by I/Q LO generation circuitry 232.

Figure 4:
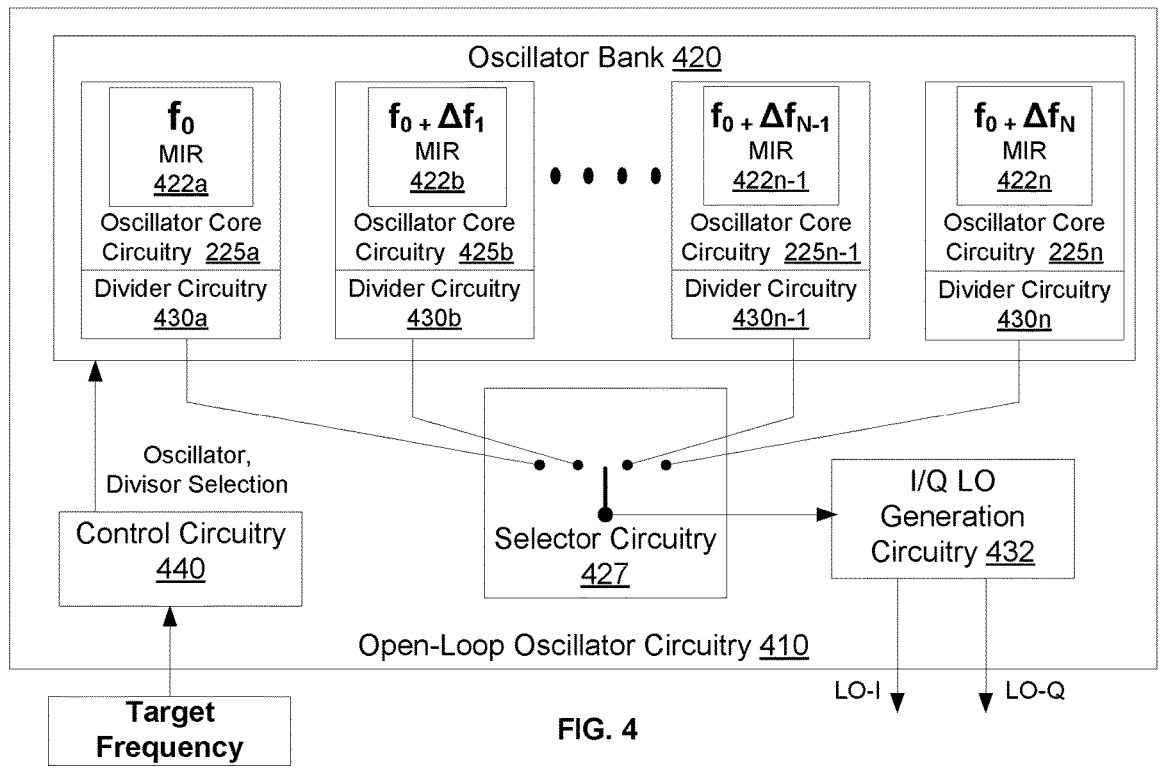
FIG. 4 illustrates an exemplary open-loop oscillator circuitry in which oscillator units include divider circuitry in accordance with various aspects described.

Referring now to FIG. 4, an exemplary open-loop oscillator circuitry 410 is illustrated in which each oscillator unit includes divider circuitry 430a-430n, respectively. This means that the oscillator signal generated by each oscillator unit is divided down to the LO frequency operating range. The selected divided oscillator signal is provided to I/Q LO generation circuitry 432, which splits the selected oscillator signal into separate I and Q LO signals. The control circuitry 440 generates an oscillator selection signal that controls selector circuitry 427 to select one of the plurality of divided oscillator signals based on the target frequency. The control circuitry 440 also generates a divisor selection signal for each divider circuitry 430a-430n based on the target frequency and a measured LO frequency.

Figure 5:
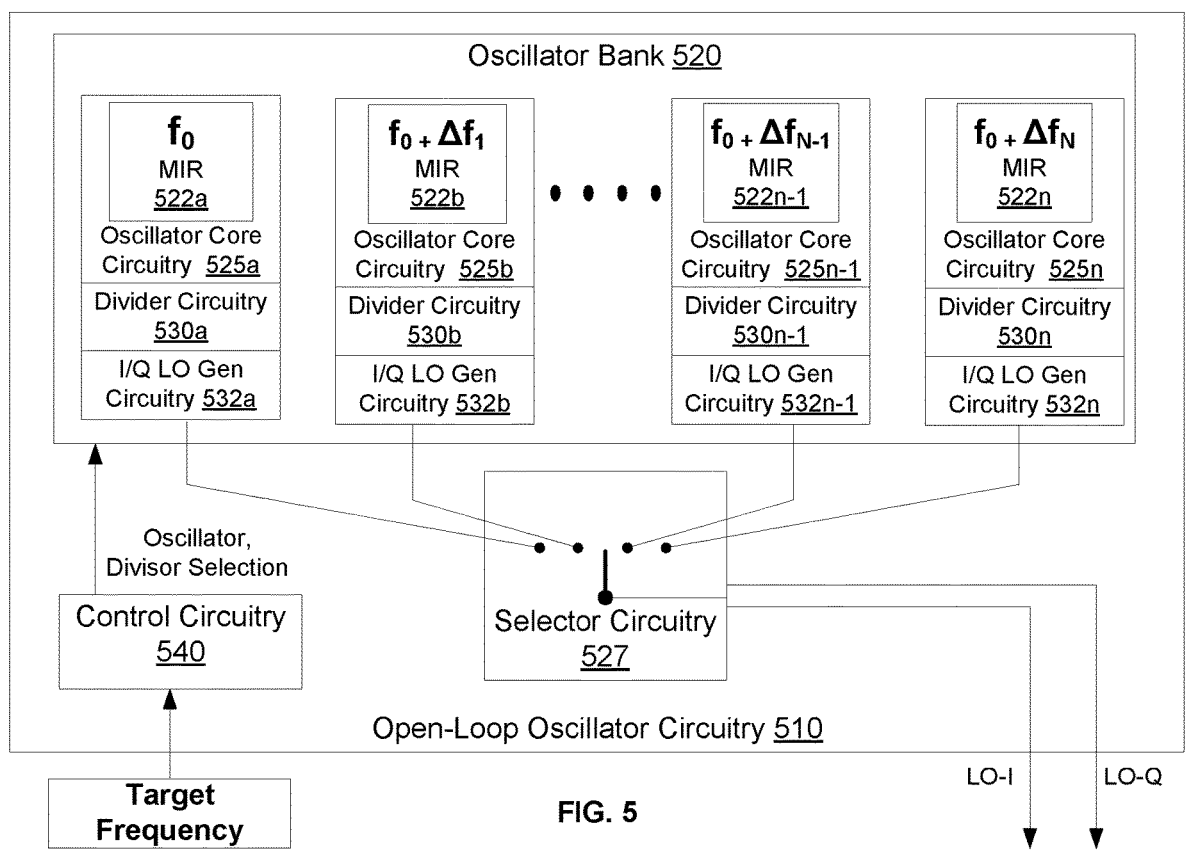
FIG. 5 illustrates an exemplary open-loop oscillator circuitry in which oscillator units include divider circuitry and I/Q local oscillator (LO) generation circuitry in accordance with various aspects described.

Referring now to FIG. 5, an exemplary open-loop oscillator circuitry 510 is illustrated in which each oscillator unit includes divider circuitry 530a-530n, respectively. Each oscillator unit also includes I/Q LO generation circuitry 532a-532n, respectively. This means that the oscillator signal generated by each oscillator unit is divided down into the LO frequency operating range and also split into separate I and Q LO signals. The control circuitry 540 generates an oscillator selection signal that controls selector circuitry 527 to select the one of the plurality of divided quadrature oscillator signals based on the target frequency. The control circuitry 540 also generates a divisor selection signal for each divider circuitry 530a-530n based on the target frequency and a measured LO frequency.

Returning now to FIG. 1, the transmitter 100 includes a modulator 190 that modulates the BB signal using the LO signal (generated using any of the alternative open-loop oscillator circuitries just discussed). The BB signal compensation circuitry 150 adjusts the BB signal to compensate for the fact that, due to the open-loop nature of the open-loop oscillator circuitry, the LO frequency is neither fixed nor precisely known. This means that the LO frequency will likely be different from the target frequency (e.g., the operating TX frequency) by varying amounts. The BB signal compensation circuitry 150 shifts the frequency of the BB signal in an opposite direction from a difference between the target frequency and a present (i.e., measured) value of the LO frequency. This will cause the output of the modulator 190 to be centered at the desired target/TX frequency.

The baseband signal compensation circuitry 150 includes a frequency measurement circuitry 160, phase correction circuitry 170, and frequency adaptation circuitry 180. The measurement circuitry 160 is configured to measure the LO frequency of the LO signal. The phase correction circuitry 170 is configured to adjust a phase of the BB signal based on a difference between the measured frequency and the target frequency to generate a rotated BB signal. The frequency adaptation circuitry 180 is configured to increase a frequency of the rotated BB signal to generate a compensated BB signal so that a sample of the compensated BB signal will be present with every Kth cycle of the LO signal (wherein K is an integer, and is 1 unless otherwise noted). The modulator 190 modulates the compensated baseband signal using the LO signal.

Returning to FIG. 2, an exemplary transmitter 200 is illustrated that includes the open-loop oscillator circuitry 210 described above (or one of the alternative circuitries of FIGS. 4 and 5) that generates an I LO signal and a Q LO signal used by a modulator 290 to modulate a BB signal. BB signal compensation circuitry 250 includes LO measurement circuitry 260, phase correction circuitry 270, and a fractional upsampler 280. The measurement circuitry 260 includes frequency measurement circuitry 262 configured to continuously and accurately measure the LO frequency over some time base that is determined based on a reference frequency.

The phase correction circuitry 270 includes a difference element 272 that determines a difference between the measured frequency and the target frequency and an integrator element 273 that accumulates the difference to generate a phase correction signal. An inverter element 275 inverts the phase correction signal determined by the integrator element 273 so that the BB signal will be shifted in an opposite direction to compensate for the difference. Phase rotator circuitry 279, which is a coordinate rotation digital computer (CORDIC) in one example, adjusts the phase of the BB signal based on the phase correction signal to generate a rotated BB signal. In this manner, the measured LO frequency is compared with the target frequency and the difference is then transformed into a phase domain phase correction signal which is added to the quadrature BB data signals to generate quadrature rotated BB signals (often referred to a single BB signal for simplicity).

In addition to compensating the BB signal based on the difference in the measured LO frequency and the target LO frequency, it may be useful to additionally track the phase of the LO signal to allow for coherent transmission re-start after, for example, intermediate transmitter muting or to synchronize multiple transmitters in phase. To this end, the LO measurement circuitry 260 includes phase measurement circuitry 268 configured to determine the actual LO signal phase in relation to the fixed system clock time base signal. Start phase circuitry 276 is configured to calculate a predicted phase of the LO signal at a start time. When the transmitter is turned on synchronous to the time base, the measured initial phase delta is calculated by difference circuitry 278 and stored in a register or latch 277 as a phase correction factor. The phase correction factor added to the integrated phase from the integrator element 273 by combination circuitry 274 to adjust a start phase of the phase correction signal based on the phase correction factor. To avoid phase ambiguities, the integrator element 273 should be reset together with the latching of the initial phase information in the latch 277.

The rotated BB signal is provided to a fractional upsampler that resamples the rotated BB signal to generate a compensated or resampled baseband signal, which has a frequency corresponding to an integer (K) fraction of the LO frequency. In this manner, the fractional upsampler upsamples the rotated BB signal to the measured frequency of the LO signal to allow a proper pickup of a sample of the compensated BB signal with each (Kth) cycle of the LO signal by the modulator 290.

FIG. 3 illustrates a transmitter 300 that includes the open-loop oscillator circuitry 210 of FIG. 2 and BB signal compensation circuitry 350. Rather than a fractional upsampler, the BB signal compensation circuitry 350 includes an analog-to-digital converter 380 that converts the rotated baseband signal to an analog converted BB signal having a frequency suitable for modulation with the LO frequency. In this example, modulator 390 includes mixers 392, 394 that perform complex multiplication on the analog converted or compensated BB signal.

Figure 6:
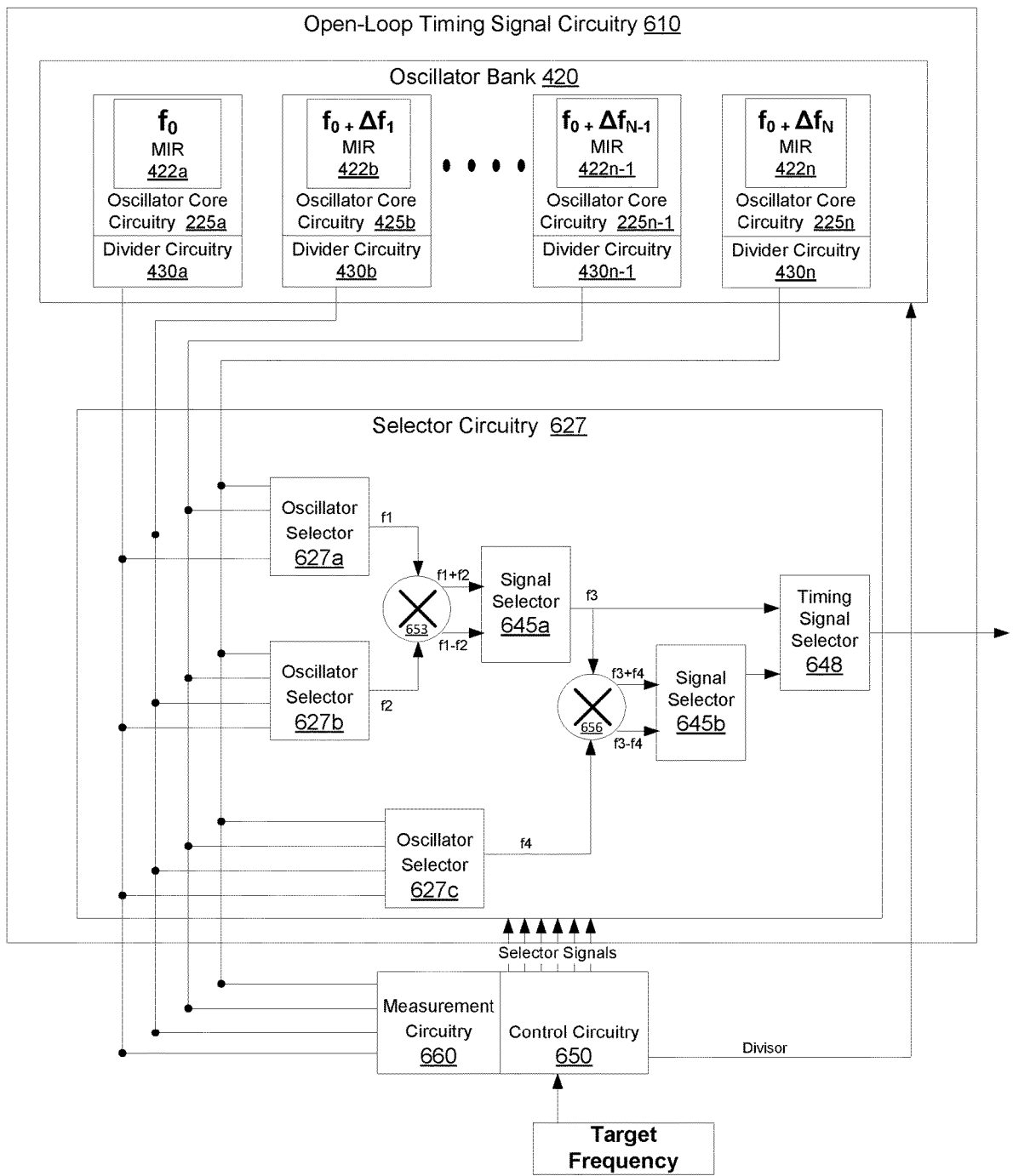
FIG. 6 illustrates an exemplary timing signal generation system that includes open-loop oscillator circuitry and combination circuitry in accordance with various aspects described.

Turning now to FIG. 6, an exemplary a timing signal system is illustrated that generates a timing signal having a target frequency. The timing signal system includes open-loop timing signal circuitry 610, control circuitry 650, and measurement circuitry 660. The timing signal system generates timing signals by combining timing signals generated by MIR-based oscillator units in an oscillator bank 420 (as described with reference to FIG. 4). The open-loop timing signal circuitry 610 includes selector circuitry 627 that selects various oscillator signals and combination circuitry (e.g., a mixer) that combines various oscillator signals based on selector control signals from the control circuitry 650. The selector circuitry 627 includes a first oscillator selector circuitry 627a configured to select and output one of the oscillator signals as a first oscillator signal having a first oscillator frequency f1. The selector circuitry 627 includes a second oscillator selector circuitry 627b configured to select and output one of the oscillator signals as a second oscillator signal having a second oscillator frequency f2. The first oscillator signal and the second oscillator are combined to generate the timing signal.

In one example, the selector circuitry 627 includes a first mixer 653 configured to combine the first oscillator signal and the second oscillator signal to generate i) a first output signal having a frequency corresponding to a sum of the first oscillator frequency and the second oscillator frequency (f1+f2) and ii) a second output signal having a frequency corresponding to a difference between the first oscillator frequency and the second oscillator frequency (f1−f2). The selector circuitry 627 includes a first signal selector 645a configured to select and output one of the first output signal and the second output signal a first timing signal having frequency f3.

The selector circuitry 627 includes a third oscillator selector circuitry 627c configured to select and output one of the oscillator signals as a third oscillator signal having a third oscillator frequency f4. The selector circuitry 627 includes a second mixer 656 configured to combine the third oscillator signal and the selected one of the first output signal and the second output signal to generate i) a third output signal having a frequency corresponding to a sum of the third oscillator frequency and a frequency of the selected one of the first output signal and the second output signal (f3+f4) and ii) a fourth output signal having a frequency corresponding to a difference between the third oscillator frequency and a frequency of the selected one of the first output signal and the second output signal (f3−f4). The selector circuitry 627 includes a second signal selector 645b configured to select and output one of the third output signal and the fourth output signal as a second timing signal. A timing signal selector 648 is used to select one of the timing signals. While two "stages" of combination are illustrated in FIG. 6, any number of stages may be used.

The measurement circuitry 660 is configured to measure a frequency of each of the oscillator signals. The control circuitry 660 generates selector signals to control the various elements of the selector circuitry 627 based on the measured frequencies of the oscillator signals and the target frequency. The control circuitry 650 also determines a divisor each of the oscillator units based on the measured frequencies of the oscillator signals and the target frequency. In this manner as the MIR resonance frequencies drift, different oscillator signals may be used to maintain the desired target frequency.

Figure 7:
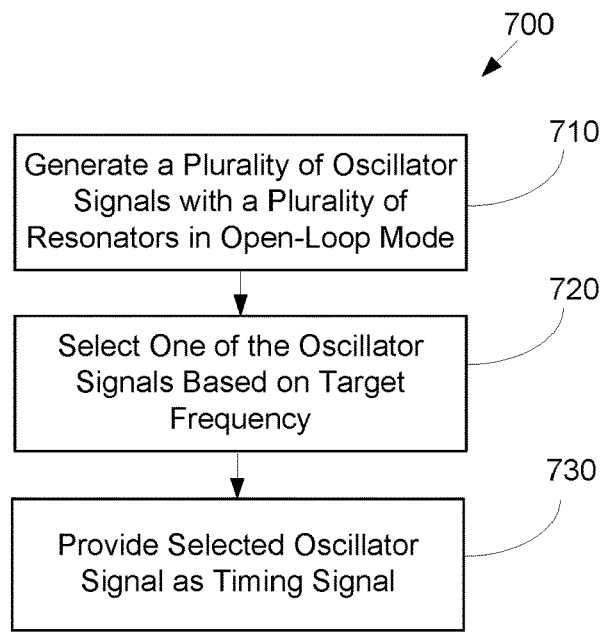
FIG. 7 illustrates an exemplary flow diagram of an exemplary method of generating a timing signal using open-loop resonators in accordance with various aspects described.

FIG. 7 illustrates a flow diagram outlining an exemplary method 700 to generate a timing signal based on a target frequency. The method 700 may be performed by open-loop oscillator circuitries 110, 210, 410, 510, or 610 of FIGS. 1-6. The method includes, at 710, generating a plurality of oscillator signals with a respective plurality of resonators operating in an open-loop mode. At 720 one of the oscillator signals is selected based on the target frequency and at 730, the method includes providing the selected oscillator signal as the timing signal.

Figure 8:
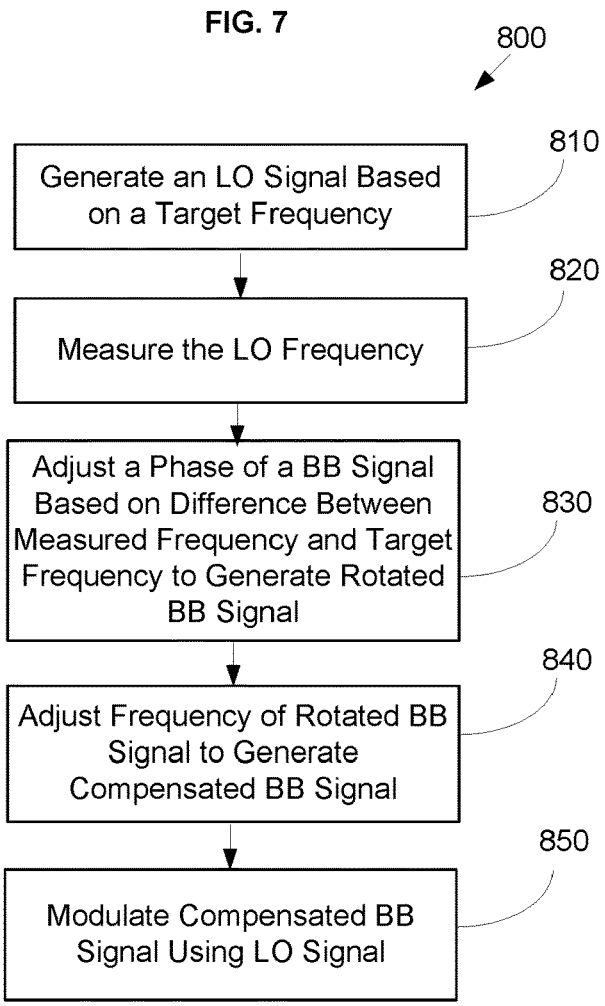
FIG. 8 illustrates an exemplary flow diagram of an exemplary method of transmitting and receiving a radio frequency RF signal in accordance with various aspects described.

FIG. 8 illustrates a flow diagram outlining an exemplary method 800 to transmit and receive signals having a target frequency. The method 800 may be performed by transmitters 100, 200, and 300 of FIGS. 1A, 1B, 2, and 3, respectively. The method includes, at 810, generating a local oscillator (LO) signal having an LO frequency based on the target frequency. At 820 the LO frequency of the LO signal is measured. A phase of a baseband signal is adjusted based on a difference between the measured frequency and the target frequency to generate a rotated baseband signal at 830. The method includes, at 840, increasing a frequency of the rotated baseband signal to generate a compensated baseband signal. At 850 the method includes modulating the compensated baseband signal using the LO signal.

It can be seen from the foregoing description that the proposed architectures can be implemented in modern FinFET technologies without special technological features. Further, the architecture is largely digital, featuring signal processing requirements to digitally phase/frequency shift the baseband signals. The described MIR-based oscillator bank is a very small circuit and that can be placed directly in vicinity of each receiver/transmitter, allowing for a very short LO signal lines, which saves a significant amount of power consumption.

Figure 9:
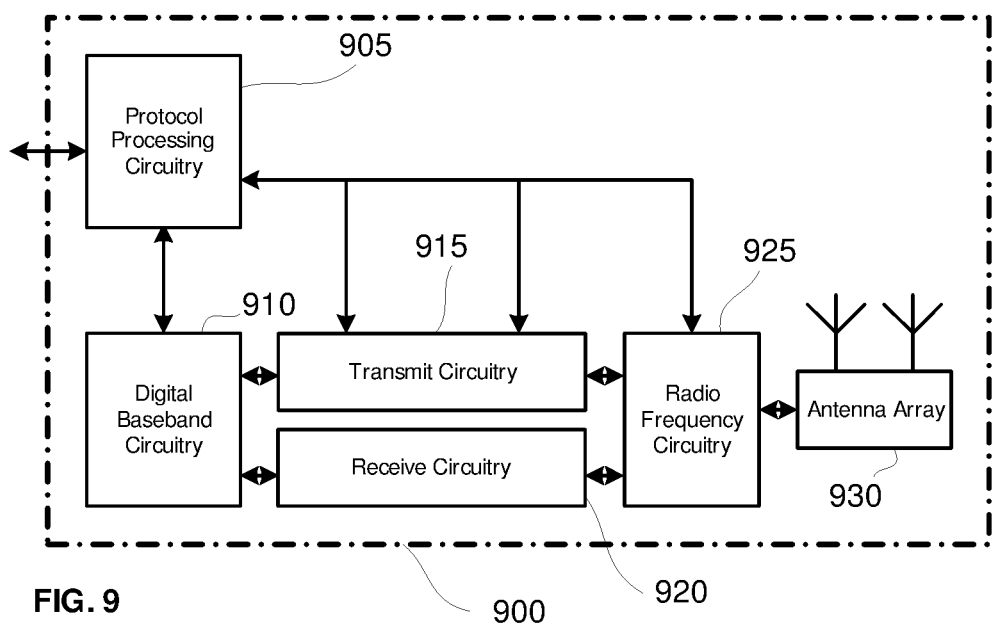
FIG. 9 illustrates an exemplary transceiver system in accordance with various aspects described.

FIG. 9 illustrates an exemplary millimeter wave communication circuitry 900 (e.g., transceiver) according to some aspects. Circuitry 900 is alternatively grouped according to functions. Components as shown in 900 are shown here for illustrative purposes and may include other components not shown here in FIG. 9.

Millimeter wave communication circuitry 900 may include protocol processing circuitry 905, which may implement one or more of medium access control (MAC), radio link control (RLC), packet data convergence protocol (PDCP), radio resource control (RRC) and non-access stratum (NAS) functions. Protocol processing circuitry 905 may include one or more processing cores (not shown) to execute instructions and one or more memory structures (not shown) to store program and data information.

Millimeter wave communication circuitry 900 may further include digital baseband circuitry 910, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 900 may further include transmit circuitry 915, receive circuitry 920 and/or antenna array circuitry 930. Millimeter wave communication circuitry 900 may further include radio frequency (RF) circuitry 925. In an aspect of the invention, RF circuitry 925 may include multiple parallel RF chains for one or more of transmit or receive functions, each connected to one or more antennas of the antenna array 930.

In an aspect of the disclosure, protocol processing circuitry 905 may include one or more instances of control circuitry (not shown) to provide control functions for one or more of digital baseband circuitry 910, transmit circuitry 915, receive circuitry 920, and/or radio frequency circuitry 925. RF circuitry 925 may include timing signal generation systems or perform timing signal generation methods according to the examples described herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for generating timing signals according to embodiments and examples described herein.

Example 1 is an open-loop oscillator circuitry configured to generate a timing signal based on a target frequency, including a plurality of oscillator units and a selector circuitry. The plurality of oscillator units is configured to generate a respective plurality of oscillator signals, wherein each oscillator unit includes a resonator that operates in an open-loop mode to generate a resonator signal having a resonator frequency, wherein the resonator signal is used by core circuitry to generate a respective oscillator signal having a respective oscillator frequency, further wherein the resonator frequencies of the resonators in the plurality of oscillator units are different from one another. The selector circuitry is configured to select one of the plurality of oscillator units and provide a selected oscillator signal generated by the selected oscillator unit as the timing signal.

Example 2 includes the subject matter of example 1, including or omitting optional elements, further including control circuitry configured to control the selector circuitry to select the one of the plurality of oscillator units based on the target frequency.

Example 3 includes the subject matter of example 1, including or omitting optional elements, further including a divider circuitry configured to divide a frequency of the selected oscillator signal by a divisor to generate a divided signal, wherein the timing signal includes the divided signal.

Example 4 includes the subject matter of example 3, including or omitting optional elements, wherein each oscillator unit includes a divider circuitry.

Example 5 includes the subject matter of example 3, including or omitting optional elements, further including control circuitry configured to control the selector circuitry to select the one of the plurality of oscillator units based on the target frequency and determine the divisor based on the target frequency and the oscillator frequency of the selected oscillator unit.

Example 6 includes the subject matter of example 1, including or omitting optional elements, wherein the selector circuitry includes a first oscillator selector circuitry configured to select and output one of the oscillator signals as a first oscillator signal having a first oscillator frequency and a second oscillator selector circuitry configured to select and output one of the oscillator signals as a second oscillator signal having a second oscillator frequency and a combination circuitry configured to combine the first oscillator signal and the second oscillator to generate the timing signal.

Example 7 includes the subject matter of example 6, including or omitting optional elements, wherein the combination circuitry includes a first mixer configured to combine the first oscillator signal and the second oscillator signal to generate a first output signal having a frequency corresponding to a sum of the first oscillator frequency and the second oscillator frequency and a second output signal having a frequency corresponding to a difference between the first oscillator frequency and the second oscillator frequency; and the selector circuitry includes a first signal selector configured to select and output one of the first output signal and the second output signal as a first timing signal.

Example 8 includes the subject matter of example 7, including or omitting optional elements, wherein the selector circuitry further includes a third oscillator selector circuitry configured to select and output one of the oscillator signals as a third oscillator signal having a third oscillator frequency; the combination circuitry further includes a second mixer configured to combine the third oscillator signal and the selected one of the first output signal and the second output signal to generate a third output signal having a frequency corresponding to a sum of the third oscillator frequency and a frequency of the selected one of the first output signal and the second output signal and a fourth output signal having a frequency corresponding to a difference between the third oscillator frequency and a frequency of the selected one of the first output signal and the second output signal; and the selector circuitry further includes a second signal selector configured to select and output one of the third output signal and the fourth output signal as a second timing signal.

Example 9 includes the subject matter of example 1, including or omitting optional elements, wherein the resonator includes a FinFET device.

Example 10 includes the subject matter of example 1, including or omitting optional elements, wherein the resonator and the selector circuitry are monolithically integrated on the same semiconductor device.

Example 11 includes the subject matter of example 1, including or omitting optional elements, further including measurement circuitry configured to measure a frequency of each of the oscillator signals; and control circuitry configured to control the combination circuitry based on the measured frequencies of the oscillator signals and the target frequency.

Example 12 includes the subject matter of example 11, including or omitting optional elements, wherein the control circuitry is further configured to determine a divisor for one or more of the oscillator units based on the measured frequencies of the oscillator signals and the target frequency.

Example 13 is a transceiver configured to transmit or receive signals having a target frequency, including an open-loop oscillator circuitry configured to generate a local oscillator (LO) signal having an LO frequency based on the target frequency; and a baseband signal compensation circuitry including a frequency measurement circuitry configured to measure the LO frequency of the LO signal; phase correction circuitry configured to adjust a phase of a baseband signal based on a difference between the measured frequency and the target frequency to generate a rotated baseband signal; frequency adaptation circuitry configured to adapt a frequency of the rotated baseband signal to generate a compensated baseband signal; and a modulator configured to modulate the compensated baseband signal using the LO signal.

Example 14 includes the subject matter of example 13, including or omitting optional elements, wherein the phase correction circuitry includes an integrator element that accumulates a difference between the target frequency and the measured frequency to generate a phase correction signal and phase rotator circuitry that adjusts the phase of the baseband signal based on the phase correction signal.

Example 15 includes the subject matter of example 14, including or omitting optional elements, wherein the phase correction circuitry includes a phase measurement circuitry configured to measure a phase of the LO signal; start phase circuitry configured to calculate a predicted phase of the LO signal at a predetermined start time; and difference circuitry configured to determine a difference between the predicted phase and the measured phase of the LO signal at the predetermined start time and store the difference as a phase correction factor; and combination circuitry configured to adjust a start phase of the phase correction signal based on the phase correction factor.

Example 16 includes the subject matter of example 13, including or omitting optional elements, wherein the frequency adaptation circuitry includes a fractional upsampler that resamples the rotated baseband signal to generate the resampled baseband signal having a frequency corresponding to an integer fraction of the LO frequency.

Example 17 includes the subject matter of example 13, including or omitting optional elements, wherein the frequency adaptation circuitry includes an analog-to-digital converter that converts the rotated baseband signal to an analog signal to generate the compensated signal.

Example 18 includes the subject matter of example 13, including or omitting optional elements, wherein the open-loop oscillator circuitry includes a plurality of oscillator units, wherein each oscillator unit includes a resonator that operates in an open-loop mode to generate a resonator signal having a resonator frequency; and core circuitry configured to generate, from the resonator signal, an oscillator signal having an oscillator frequency, wherein the resonator frequencies of the resonators in the plurality of oscillator units are different from one another; and a selector circuitry configured to select one of the plurality of oscillator signals and output the selected oscillator signal as the LO signal.

Example 19 is a method to generate a timing signal based on a target frequency, including generating a plurality of oscillator signals with a respective plurality of resonators operating in an open-loop mode; selecting one of the oscillator signals based on the target frequency; and providing the selected oscillator signal as the timing signal.

Example 20 includes the subject matter of example 19 including or omitting optional elements, further including dividing a frequency of the selected oscillator signal by a divisor to generate a divided oscillator signal, wherein the timing signal includes the divided oscillator signal.

Example 21 includes the subject matter of example 19, including or omitting optional elements, further including selecting a first oscillator signal having a first oscillator frequency; and selecting a second oscillator signal having a second oscillator frequency; and combining the first oscillator signal and the second oscillator to generate the timing signal.

Example 22 includes the subject matter of example 21, including or omitting optional elements, further including combining the first oscillator signal and the second oscillator signal to generate a first output signal having a frequency corresponding to a sum of the first oscillator frequency and the second oscillator frequency and a second output signal having a frequency corresponding to a difference between the first oscillator frequency and the second oscillator frequency; and selecting one of the first output signal and the second output signal as the timing signal.

Example 23 includes the subject matter of example 22, including or omitting optional elements, further including selecting a third oscillator signal having a third oscillator frequency; combining the third oscillator signal and the selected one of the first output signal and the second output signal to generate a third output signal having a frequency corresponding to a sum of the third oscillator frequency and a frequency of the selected one of the first output signal and the second output signal and a fourth output signal having a frequency corresponding to a difference between the third oscillator frequency and a frequency of the selected one of the first output signal and the second output signal; and selecting one of the third output signal and the fourth output signal as the timing signal.

Example 24 is a method to transmit and receive signals having a target frequency, including: generating a local oscillator (LO) signal having an LO frequency based on the target frequency; and measuring the LO frequency of the LO signal; adjusting a phase of a baseband signal based on a difference between the measured frequency and the target frequency to generate a rotated baseband signal; increasing a frequency of the rotated baseband signal to generate a compensated baseband signal; and modulating the compensated baseband signal using the LO signal.

Example 25 includes the subject matter of example 24, including or omitting optional elements, further including accumulating a difference between the target frequency and the measured frequency to generate a phase correction signal; and adjusting the phase of the baseband signal based on the phase correction signal.

Example 26 includes the subject matter of example 25, including or omitting optional elements, further including measuring a phase of the LO signal; calculating a predicted phase of the LO signal at a predetermined start time; and determining a difference between the predicted phase and the measured phase of the LO signal at the predetermined start time; storing the difference as a phase correction factor; and adjusting a start phase of the phase correction signal based on the phase correction factor at the predetermined start time.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. An open-loop oscillator circuitry configured to generate a timing signal based on a target frequency, comprising:
   a plurality of oscillator units configured to generate a respective plurality of oscillator signals, wherein each oscillator unit comprises a resonator that operates in an open-loop mode to generate a resonator signal having a resonator frequency, wherein the resonator comprises an arrangement of one or more multigate devices, and wherein the resonator signal is used by core circuitry to generate a respective oscillator signal having a respective oscillator frequency, further wherein the resonator frequencies of the resonators in the plurality of oscillator units are different from one another; and
   a selector circuitry configured to:
     select one of the plurality of oscillator units; and
     provide a selected oscillator signal generated by the selected oscillator unit as the timing signal;
   a divider circuitry configured to divide a frequency of the selected oscillator signal by a divisor to generate a divided signal, wherein the timing signal comprises the divided signal; and
   a control circuitry configured to:
     control the selector circuitry to select the one of the plurality of oscillator units based on the target frequency; and
     determine the divisor based on the target frequency and the oscillator frequency of the selected oscillator unit.

2. The open-loop oscillator circuitry of claim 1, further comprising control circuitry configured to control the selector circuitry to select the one of the plurality of oscillator units based on the target frequency.

3. The open-loop oscillator circuitry of claim 1, wherein each oscillator unit comprises a divider circuitry.

4. The open-loop oscillator circuitry of claim 1, wherein:
   the selector circuitry comprises:
     a first oscillator selector circuitry configured to select and output one of the oscillator signals as a first oscillator signal having a first oscillator frequency;
     a second oscillator selector circuitry configured to select and output one of the oscillator signals as a second oscillator signal having a second oscillator frequency; and
     a combination circuitry configured to combine the first oscillator signal and the second oscillator to generate the timing signal.

5. The open-loop oscillator circuitry of claim 4, wherein:
   the combination circuitry comprises a first mixer configured to combine the first oscillator signal and the second oscillator signal to generate a first output signal having a frequency corresponding to a sum of the first oscillator frequency and the second oscillator frequency and a second output signal having a frequency corresponding to a difference between the first oscillator frequency and the second oscillator frequency; and
   the selector circuitry comprises a first signal selector configured to select and output one of the first output signal and the second output signal as a first timing signal.

6. The open-loop oscillator circuitry of claim 5, wherein:
   the selector circuitry further comprises a third oscillator selector circuitry configured to select and output one of the oscillator signals as a third oscillator signal having a third oscillator frequency;
   the combination circuitry further comprises a second mixer configured to combine the third oscillator signal and the selected one of the first output signal and the second output signal to generate a third output signal having a frequency corresponding to a sum of the third oscillator frequency and a frequency of the selected one of the first output signal and the second output signal and a fourth output signal having a frequency corresponding to a difference between the third oscillator frequency and a frequency of the selected one of the first output signal and the second output signal; and the selector circuitry further comprises a second signal selector configured to select and output one of the third output signal and the fourth output signal as a second timing signal.

7. The open-loop oscillator circuitry of claim 1, wherein the resonator comprises an arrangement of one or more FinFET devices.

8. The open-loop oscillator circuitry of claim 1, wherein the resonator and the selector circuitry are monolithically integrated on the same semiconductor device.

9. The open-loop oscillator circuitry of claim 4, further comprising:
measurement circuitry configured to measure a frequency of each of the oscillator signals; and
control circuitry configured to control the combination circuitry based on the measured frequencies of the oscillator signals and the target frequency.

10. The open-loop circuitry of claim 9, wherein the control circuitry is further configured to determine a divisor for one or more of the oscillator units based on the measured frequencies of the oscillator signals and the target frequency.

11. A transceiver configured to transmit or receive signals having a target frequency, comprising:
an open-loop oscillator circuitry configured to generate a local oscillator (LO) signal having an LO frequency based on the target frequency; and
a baseband signal compensation circuitry comprising:
a frequency measurement circuitry configured to measure the LO frequency of the LO signal;
phase correction circuitry configured to adjust a phase of a baseband signal based on a difference between the measured frequency and the target frequency to generate a rotated baseband signal;
frequency adaptation circuitry configured to adapt a frequency of the rotated baseband signal to generate a compensated baseband signal; and
a modulator configured to modulate the compensated baseband signal using the LO signal.

12. The transceiver of claim 11, wherein the phase correction circuitry comprises:
an integrator element that accumulates a difference between the target frequency and the measured frequency to generate a phase correction signal; and
phase rotator circuitry that adjusts the phase of the baseband signal based on the phase correction signal.

13. The transceiver of claim 12, wherein the phase correction circuitry comprises:
a phase measurement circuitry configured to measure a phase of the LO signal;
start phase circuitry configured to calculate a predicted phase of the LO signal at a predetermined start time; and
difference circuitry configured to determine a difference between the predicted phase and the measured phase of the LO signal at the predetermined start time and store the difference as a phase correction factor; and
combination circuitry configured to adjust a start phase of the phase correction signal based on the phase correction factor.

14. The transceiver of claim 11, wherein the frequency adaptation circuitry comprises a fractional upsampler that resamples the rotated baseband signal to generate the resampled baseband signal having a frequency corresponding to an integer fraction of the LO frequency, wherein the resampled signal is the compensated signal.

15. The transceiver of claim 11, wherein the frequency adaptation circuitry comprises an analog-to-digital converter that converts the rotated baseband signal to an analog signal to generate a converted signal, wherein the converted signal is the compensated signal.

16. The transceiver of claim 11, wherein the open-loop oscillator circuitry comprises:
a plurality of oscillator units, wherein each oscillator unit comprises:
a resonator that operates in an open-loop mode to generate a resonator signal having a resonator frequency; and
core circuitry configured to generate, from the resonator signal, an oscillator signal having an oscillator frequency,
wherein the resonator frequencies of the resonators in the plurality of oscillator units are different from one another; and
a selector circuitry configured to:
select one of the plurality of oscillator signals; and
output the selected oscillator signal as the LO signal.

17. A method to generate a timing signal based on a target frequency, comprising:
generating a plurality of oscillator signals with a respective plurality of resonators operating in an open-loop mode, wherein each of the respective plurality of resonators comprises an arrangement of one or more multigate devices;
selecting one of the oscillator signals based on the target frequency;
determining a divisor based on the target frequency and the oscillator frequency of the selected oscillator unit;
generating a divided signal comprising dividing a frequency of the selected oscillator signal by the determined divisor; and
providing the timing signal comprising the divided oscillator signal.

18. The method of claim 17, further comprising:
selecting a first oscillator signal having a first oscillator frequency;
selecting a second oscillator signal having a second oscillator frequency; and
combining the first oscillator signal and the second oscillator to generate the timing signal.

19. The method of claim 18, further comprising:
combining the first oscillator signal and the second oscillator signal to generate a first output signal having a frequency corresponding to a sum of the first oscillator frequency and the second oscillator frequency and a second output signal having a frequency corresponding to a difference between the first oscillator frequency and the second oscillator frequency; and
selecting one of the first output signal and the second output signal as the timing signal.

20. The method of claim 19, further comprising:
selecting a third oscillator signal having a third oscillator frequency;
combining the third oscillator signal and the selected one of the first output signal and the second output signal to generate a third output signal having a frequency corresponding to a sum of the third oscillator frequency and a frequency of the selected one of the first output signal and the second output signal and a fourth output signal having a frequency corresponding to a difference between the third oscillator frequency and a frequency of the selected one of the first output signal and the second output signal; and selecting one of the third output signal and the fourth output signal as the timing signal.

21. A method to transmit and receive signals having a target frequency, comprising:
generating a local oscillator (LO) signal having an LO frequency based on the target frequency;
measuring the LO frequency of the LO signal;
adjusting a phase of a baseband signal based on a difference between the measured frequency and the target frequency to generate a rotated baseband signal;
adjusting a frequency of the rotated baseband signal to generate a compensated baseband signal; and
modulating the compensated baseband signal using the LO signal.

22. The method of claim 21, further comprising:
accumulating a difference between the target frequency and the measured frequency to generate a phase correction signal; and
adjusting the phase of the baseband signal based on the phase correction signal.

23. The method of claim 22, further comprising:
measuring a phase of the LO signal;
calculating a predicted phase of the LO signal at a predetermined start time;
determining a difference between the predicted phase and the measured phase of the LO signal at the predetermined start time;
storing the difference as a phase correction factor; and
adjusting a start phase of the phase correction signal based on the phase correction factor at the predetermined start time.

\* \* \* \* \*